(12) United States Patent
Mantrawadi et al.

(10) Patent No.: US 10,389,454 B2
(45) Date of Patent: Aug. 20, 2019

(54) CROSS-TALK BLOCKING STRUCTURES FOR EM COMMUNICATION

(71) Applicant: Keyssa Systems, Inc., Campbell, CA (US)

(72) Inventors: Giriraj Mantrawadi, Portland, OR (US); Dennis F. Rosenauer, Tigard, OR (US); Ian A. Kyles, West Linn, OR (US); Eric Sweetman, Portland, OR (US); Roger D. Isaac, San Jose, CA (US); Stephan Lang, San Jose, CA (US)

(73) Assignee: Keyssa Systems, Inc., Campbell, CA (US)

( * ) Notice: Subject to any disclaimer, the term of this patent is extended or adjusted under 35 U.S.C. 154(b) by 0 days.

(21) Appl. No.: 14/968,739

(22) Filed: Dec. 14, 2015

(65) Prior Publication Data
US 2017/0170913 A1    Jun. 15, 2017

(51) Int. Cl.
*H04B 15/00* (2006.01)
*H05K 3/36* (2006.01)

(52) U.S. Cl.
CPC ............... *H04B 15/00* (2013.01); *H05K 3/36* (2013.01)

(58) Field of Classification Search
CPC ...... H04B 15/00; H04B 1/123; H04B 5/0031; H04B 5/02; H04W 4/008; H05K 3/36
See application file for complete search history.

(56) References Cited

U.S. PATENT DOCUMENTS

| 4,518,737 | A | * | 5/1985 | Traut | B29C 67/02 252/519.33 |
| 5,547,599 | A | * | 8/1996 | Wolfrey | C08G 59/226 252/62.54 |
| 5,898,909 | A | * | 4/1999 | Yoshihara | H01L 23/552 257/E23.114 |
| 8,714,459 | B2 | | 5/2014 | McCormack et al. | |
| 8,909,135 | B2 | | 12/2014 | McCormack et al. | |
| 2011/0024627 | A1 | * | 2/2011 | Yao | G01J 1/02 250/338.4 |
| 2014/0273853 | A1 | * | 9/2014 | Isaac | H04B 5/0031 455/41.2 |

(Continued)

OTHER PUBLICATIONS

Van Wagoner, Quora.com answer to "Can an electromagnetic wave penetrate a metal shell?", Dec. 4, 2014, accessible at https://www.quora.com/Can-an-electromagnetic-wave-penetrate-a-metal-shell (last accessed Aug. 31, 2018).*

(Continued)

*Primary Examiner* — Michelle M Koeth
(74) *Attorney, Agent, or Firm* — Fish & Richardson P.C.

(57) ABSTRACT

Systems and apparatus for electromagnetic communications are provided. One of the apparatuses include a communication module, the communication module including: a printed circuit board; a plurality of integrated circuit packages, each integrated circuit package including at least one transmitter, receiver, or transceiver; a plurality of signal guiding structures, each signal guiding structure being associated with a corresponding integrated circuit package of the plurality of integrated circuit packages; and one or more signal blocking structures positioned between one or more pairs of integrated circuit packages.

18 Claims, 9 Drawing Sheets

(56) References Cited

U.S. PATENT DOCUMENTS

2015/0111496 A1* 4/2015 McCormack ........ H04B 5/0031
455/41.1

OTHER PUBLICATIONS

International Search Report and Written Option in International Application No. PCT/US16/66664, filed Dec. 14, 2016. Received Jan. 19, 2017. 15 pages.
International Preliminary Report on Patentability in International Application No. PCT/US2016/066664, filed Dec. 14, 2016, received Jun. 28, 2018, 12 pages.

* cited by examiner

CROSS-TALK BLOCKING STRUCTURES FOR EM COMMUNICATION

BACKGROUND

This specification relates to electromagnetic communications.

Advances in semiconductor manufacturing and circuit design technologies have enabled the development and production of integrated circuits (ICs) with increasingly higher operational frequencies. In turn, electronic products and systems incorporating high frequency integrated circuits are able to provide greater functionality than previous generations of products. The additional functionality has typically included the processing of increasingly larger amounts of data at increasingly higher speeds.

Many conventional electronic systems include multiple printed circuit boards (PCBs) upon which ICs are mounted, and through which various signals are routed to and from the ICs. In electronic systems with at least two PCBs and the need to communicate information between the PCBs, a variety of connector and backplane architectures have been developed to facilitate information flow between PCBs. However, conventional connector and backplane architectures typically introduce a variety of impedance discontinuities into the signal path, resulting in a degradation of signal quality or integrity. Connecting to PCBs by conventional means, e.g., signal-carrying mechanical connectors, generally creates discontinuities, requiring expensive electronics to negotiate. Conventional mechanical connectors may also wear out over time, require precise alignment and manufacturing methods, and are susceptible to mechanical jostling.

Conventional electronic systems typically include electromagnetic absorbers to prevent energy from radiating from inside a device to outside a device or vice versa. The use of these absorbers is typically to comply with regulations and/or to prevent interference between devices.

SUMMARY

In general, one innovative aspect of the subject matter described in this specification can be embodied in apparatuses that include a communication module, the communication module including: a printed circuit board; a plurality of integrated circuit packages, each integrated circuit package including at least one transmitter, receiver, or transceiver; a plurality of signal guiding structures, each signal guiding structure being associated with a corresponding integrated circuit package of the plurality of integrated circuit packages; and one or more signal blocking structures positioned between one or more pairs of integrated circuit packages.

The foregoing and other embodiments can each optionally include one or more of the following features, alone or in combination. In particular, one embodiment includes all the following features in combination. The plurality of integrated circuit packages includes one or more transmitter integrated circuit packages and one or more receiver integrated circuit packages. Each of the plurality of integrated circuit packages are positioned on a surface of the printed circuit board and wherein each signal guiding structure encircles at least a portion of the corresponding integrated circuit package. The signal guiding structures each form a channel for passing electromagnetic signals. Each signal blocking structure is positioned between channels formed by the signal guiding structures. Each signal blocking structure of the one or more signal blocking structures is composed of a silica-ferrite material. Each signal blocking structure of the one or more signal blocking structures is composed of a high heat tolerance epoxy-ferrite material. At least a first signal blocking structure is positioned on a surface of the printed circuit board. At least a first signal blocking structure is positioned on a support structure elevating the signal blocking structure above a surface of the printed circuit board. Each signal blocking structure is configured to reduce cross-talk between integrated circuit packages. The signal blocking structure reduces cross-talk due to propagation of electromagnetic signals through the printed circuit board. The signal blocking structure reduces cross-talk due to propagation of electromagnetic signals through a housing enclosing the communication module.

In general, one innovative aspect of the subject matter described in this specification can be embodied in communication modules that include a printed circuit board; a transmitter integrated circuit package; a receiver integrated circuit package; a printed circuit board, wherein the transmitter integrated circuit package and the receiver integrated circuit package are positioned on the printed circuit board; a signal blocking structure positioned between the transmitter integrated circuit package and the receiver integrated circuit package.

The foregoing and other embodiments can each optionally include one or more of the following features, alone or in combination. In particular, one embodiment includes all the following features in combination. The apparatus further includes a first signal guiding structure surrounding at least a portion of the transmitter integrated circuit package and a second signal guiding structure surrounding at least a portion of the receiver integrated circuit package. The signal blocking structure is positioned on a surface of the printed circuit board. The signal blocking structure is positioned on a support structure elevating the signal blocking structure above a surface of the printed circuit board. The signal blocking structure is configured to reduce cross-talk between the transmitter integrated circuit package and the receiver integrated circuit package. The signal blocking structure reduces cross-talk due to propagation of electromagnetic signals from the transmitter integrated circuit package through the printed circuit board. The signal blocking structure reduces cross-talk due to propagation of electromagnetic signals through a housing enclosing the communication module.

In general, one innovative aspect of the subject matter described in this specification can be embodied in apparatuses that include a communication module, the communication module including a pair of integrated circuit packages, each integrated circuit package including at least one transmitter, receiver, or transceiver; a housing, wherein the housing is configured to enclose the communication module; and a signal blocking structure, wherein the signal blocking structure is positioned relative to the housing such that the signal blocking structure is between the pair of transceiver integrated circuit packages.

The foregoing and other embodiments can each optionally include one or more of the following features, alone or in combination. In particular, one embodiment includes all the following features in combination. The signal blocking structure is positioned within a recess formed in the housing. The signal blocking structure is positioned on a support structure protruding from the housing between the pair of transceiver integrated circuit packages. The support structure is formed from the same material as the housing. The support structure is formed from a material having a different dielectric constant than the housing. A length of the support structure is specified to optimize cross-talk reduction resulting from signal propagation through the housing and through a PCB of the communication module. The housing further includes a portion composed of an absorbing material, and wherein the signal blocking structure is placed on the absorbing material. The signal blocking structure is formed as an insert portion of the housing. The signal blocking structure is affixed to a surface of the housing. The housing includes an aperture positioned over the signal blocking structure. The housing further includes a portion composed of an absorbing material, and wherein the signal blocking structure is positioned partially within the absorbing material.

In general, one innovative aspect of the subject matter described in this specification can be embodied in apparatuses that include a transmitter integrated circuit package at least partially surrounded by a first signal guiding structure forming a communication channel for signals transmitted by the transmitter integrated circuit package; a receiver integrated circuit package at least partially surrounded by a second signal guiding structure forming a communication channel for signals received by the receiver integrated circuit package; and a signal blocking structure positioned between the transmitter integrated circuit package and the receiver integrated circuit package, wherein the signal blocking structure is configured to reduce electromagnetic coupling between the transmitter integrated circuit package and the receiver integrated circuit package.

The details of one or more embodiments of the invention are set forth in the accompanying drawings and the description below. Other features, objects, and advantages of the invention will be apparent from the description and drawings, and from the claims.

BRIEF DESCRIPTION OF DRAWINGS

Like reference symbols in the various drawings indicate like elements.

DETAILED DESCRIPTION

Figure 1:
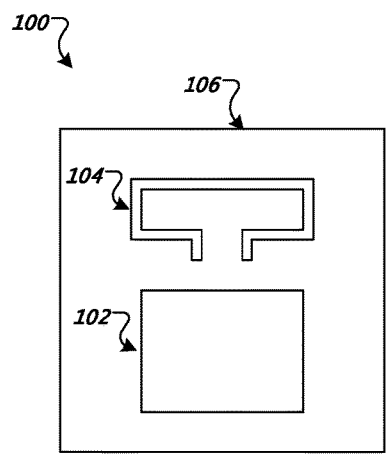
FIG. 1 is an overhead view of an example IC package.

This specification describes electromagnetic (EM) blocking structures for contactless communication. In particular, this specification describes the use of signal blocking structures to reduce cross-talk between communication channels.

Contactless communication may be used to provide signal communications between components on a device or may provide communication between devices. In one example, tightly-coupled transmitter/receiver pairs may be deployed with a transmitter disposed at a terminal portion of a first conduction path and a receiver disposed at a terminal portion of a second conduction path. The transmitter and receiver may be disposed in close proximity to each other depending on the strength of the transmitted energy, and the first conduction path and the second conduction path may not be contiguous with respect to each other. In some examples, the transmitter and receiver may be disposed on separate circuit carriers positioned with the antennas of the transmitter/receiver pair in close proximity.

A transmitter and/or receiver may be configured as an integrated circuit (IC) package, in which one or more antennas may be positioned adjacent to a die and held in place by a dielectric or insulating encapsulation or bond material. An antenna may also be held in place by a lead frame substrate. Examples of antennas embedded in IC packages are shown in the drawings and described below. Note that IC packages may also be referred to as simply packages, and are examples of contactless communication units that are also variously referred to as communication units, communication devices, comm-link chips, comm-link chip assemblies, comm-link chip packages, and/or comm-link packages, which may be configured in various ways. For example, IC packages, communication units, communication devices, comm-link chips, comm-link chip assemblies, comm-link chip packages, and/or comm-link packages may each include one or more ICs, chips, or dies and have circuit functionality appropriate for particular applications.

FIG. 1 shows an example IC package 100. The IC package 100 includes a die 102 and a transducer 104 providing conversion between electrical and electromagnetic (EM) signals. The IC package 100 may include additional structures, for example, conductive connectors, such as bond wires, electrically connecting the transducer to bond pads connected to a transmitter or receiver circuit included in die 102. The IC package 100 further includes an encapsulating material 106 formed around at least a portion of the die 102 and/or the transducer 104. In the example IC package 100, the encapsulating material 104 completely covers the die 100 and the transducer 104.

The die 102 includes any suitable structure configured as a circuit on a suitable die substrate. In some implementations, the die can alternatively be referred to as a chip or an integrated circuit. The die substrate may be composed of any suitable semiconductor material, for example, silicon. In some implementations, the die 102 has a length and a width dimension each of substantially 1.0 mm to about 2.0 mm. The die 102 may be mounted with electrical conductors, such as a lead frame, not shown in FIG. 1, electrically coupling the die 102 to one or more external circuits. The IC package 100 can further include a transformer to provide impedance matching between a circuit on the die 102 and the transducer 104.

The transducer 104 may be in the form of a folded dipole or loop antenna and is configured to transmit and/or receive electromagnetic signals. In some implementations, the antenna is configured to operate at radio frequencies including radio frequencies in the extremely high frequency (EHF) band of the electromagnetic spectrum, e.g., frequencies from 30 to 300 gigahertz. As shown in IC package 100, the antenna is separate from the die 102, but is coupled to the die 102 by suitable conductors, not shown.

The dimensions of the antenna are determined such that they are suitable for operation in the specified frequency band of the electromagnetic spectrum, e.g., the EHF band.

In one example, a loop configuration of the antenna can be configured to include a substantially 0.1 mm band of material, laid out in a loop substantially 1.4 mm long and substantially 0.53 mm wide, with a gap of substantially 0.1 mm at the mouth of the loop, and with the edge of the loop approximately 0.2 mm from the edge of die 102.

The encapsulating material 106 can be used to assist in holding the various components of IC package 100 in fixed relative positions. The encapsulating material 106 may be formed from a suitable material configured to provide electrical insulation and physical protection for the components of IC package 100. Additionally, the encapsulating material 106 can be selected from a material that does not impede, or that optimizes passage of, signals to or from the transducer 104. For example, the encapsulating material 106 can be composed of glass, plastic, or ceramic. The encapsulating material 106 may also be formed in any suitable shape. For example, the encapsulating material 106 may be in the form of a rectangular block, encapsulating all components of the IC package 100 except for any unconnected ends of conductors connecting the die 102 to external circuits.

Figure 2:
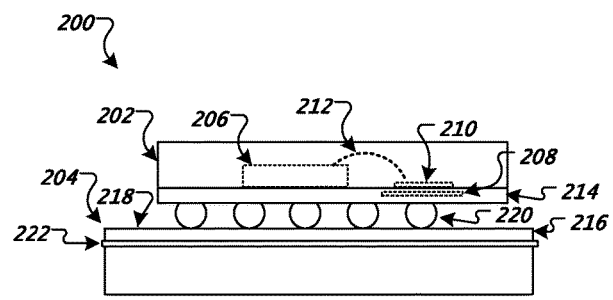
FIG. 2 shows a side view representation of an example communication device including an IC package.

FIG. 2 shows a side view representation of an example communication device 200 including an IC package 202 mounted to a PCB 204. The IC package 202 includes a die 206, a ground plane 208, an antenna 210, and one or more bond wires 212 connecting the die 206 to the antenna 210. The die 206 and antenna 210 are mounted on a package substrate 214 and encapsulated in an encapsulating material. The ground plane 208 is within the package substrate 214 and is a suitable structure configured to provide an electrical ground for the antenna 210. The ground plane 208 can extend the entire length of the package substrate 214 or just a portion, in particular, a portion underneath the antenna 210. The PCB 204 includes a top dielectric layer 216 having a surface 218. The IC package 202 is mounted to the surface 218 with mounting bumps 220 attached to a metallization pattern (not shown).

The PCB 204 also optionally includes a layer 222 spaced from dielectric layer 216 made of conductive material forming a ground plane within the PCB 204. The PCB ground plane may be any suitable structure configured to provide an electrical ground to circuits and components on the PCB 204.

Figure 3:
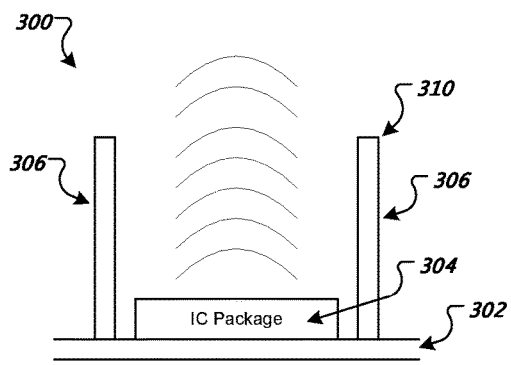
FIG. 3 is a side view of an example communication module including a signal guiding structure.

FIG. 3 is a side view of an example communication module 300 including a signal guiding structure. As shown in FIG. 3, the communication module 300 includes a PCB 302, an IC package 304, and a signal guiding structure 306 providing a signal pathway. The communication module 300, can include a transmitter or receiver for transmitting or receiving signals, e.g., radio frequency signals.

In particular, the IC package 304 can correspond to the IC packages described above with respect to FIGS. 1 and 2. The IC package 304 is mounted on the PCB 302. For example, the IC package 304 can be mounted to the PCB as described with respect to FIG. 2.

The communication module 300 can be configured to transmit or receive data using radio frequency communication. For example, if the communication module 300 includes a transmitter, the communication module 300 can transmit data, which can then be received by a receiver, e.g., of another communication module.

The signal guiding structure 306 is configured to aid in directing radio frequency (RF) signals as well as to reduce interference from spurious signals. The signal guiding structure 306 can surround a perimeter of the IC package and extend in the direction of signal transmission and/or reception by a specified amount to provide a channel for emitted or received RF signals. For example, the signal guiding structure 306 can have a height 310 suitable for a particular device including the communication module 300 and that allows the signal guiding structure 306 to be positioned in proximity to a corresponding signal guiding structure of another communication module when used to communicate with another device. The signal guiding structure can be composed of a suitable material that is configured to reduce extraneous signals without disrupting passage of communications along the channel formed by the signal guiding structure 306.

FIG. 3 illustrates one IC package 304 mounted to the PCB 302. However, in other implementations, more than one IC package can be mounted to the same PCB 302.

The communication module 300 can be part of a communication system of a device, e.g., a computer, mobile phone, tablet, kiosk, or other device/system. The communication system can be configured to provide contactless communication using one or more IC packages. For example, the communication system can include two IC packages, one configured as a transmitter and the other configured as a receiver. The communication system can be in communication with a storage device. Thus, for example, the communication system can transfer data between the data storage unit and an external device using contactless communication provided by the IC packages.

Figure 4:
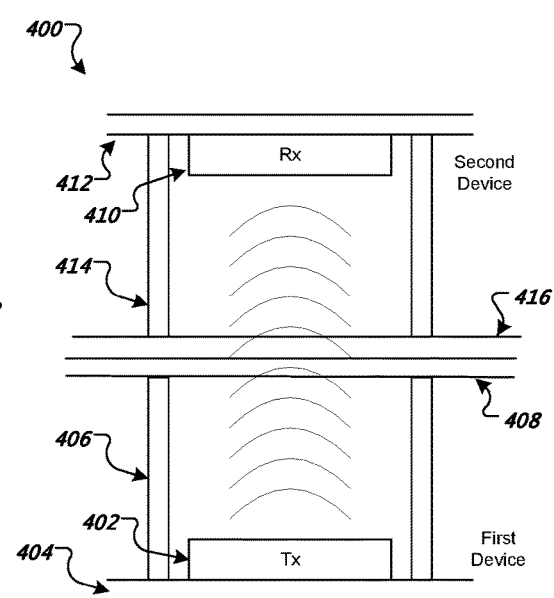
FIG. 4 is a side view diagram illustrating an example of communication between a transmitter and a receiver.

FIG. 4 is a side view diagram 400 illustrating an example of communication between a transmitter and a receiver. For example, a user of a first device may wish to exchange data with a second device. The two devices can be positioned in proximity to each other such that the respective communication modules for transmitting and receiving data are aligned and in range of each other. In particular, for EHF frequencies, the transmitter and receiver of the two devices may need to be within specified distances. The distances can vary, for example, depending on the particular frequencies used, the materials between the transmitter and receiver, and the strength of the transmission.

In FIG. 4, a first device includes a first communication module having a transmitter IC package 402 positioned on a first PCB 404. The transmitter IC package 402 is surrounded by a first signal guiding structure 406 forming a channel. The first signal guiding structure 406 extends to a surface of a first housing 408 of the first device. For example, the first device can be a first mobile phone and the first housing 408 can correspond to the outer case of the first mobile phone.

A second device includes a second communication module having a receiver IC package 410 positioned on a second PCB 412. The receiver IC package 410 is surrounded by a second signal guiding structure 414 forming a channel. The second signal guiding structure 414 extends to a surface of a second housing 416 of the second device. For example, the second device can be a second mobile phone and the second housing 416 can correspond to the outer case of the second mobile phone.

As illustrated by diagram 400, the first signal guiding structure 406 and the second signal guiding structure 414 are aligned and an outer surface of the first housing 408 and the second housing 416 are in physical contact to provide optimal communication distance and interference.

A data transmission from the transmitter IC package 402 passes through the channel formed by the first signal guiding structure 406 and the second signal guiding structure 414 to the receiver IC package 410. For example, a pair of devices can communicate data between each other by transmitting data from the transmitter IC package 402 to the receiver IC package 410. The signal guiding structures along with a proper alignment can maximize the power of the transmission that is received by the receiver IC package. In some implementations, the signal guiding structures can be formed from, or include a layer of, a metallic material that reflects the transmitted data along the signal guiding structures toward the receiver. In some other implementations, the signal guiding structures can be formed from, or include a layer of, an electromagnetic absorbing material to reduce stray signals that may cause interference.

Although transmitted signals from a transmitter are intended for receipt by a particular receiver, cross talk caused by leaking of signal to another channel can result in unintended coupling that interferes with communication on that other channel. Example sources of cross-talk are illustrated in FIGS. 5 and 6.

Figure 5:
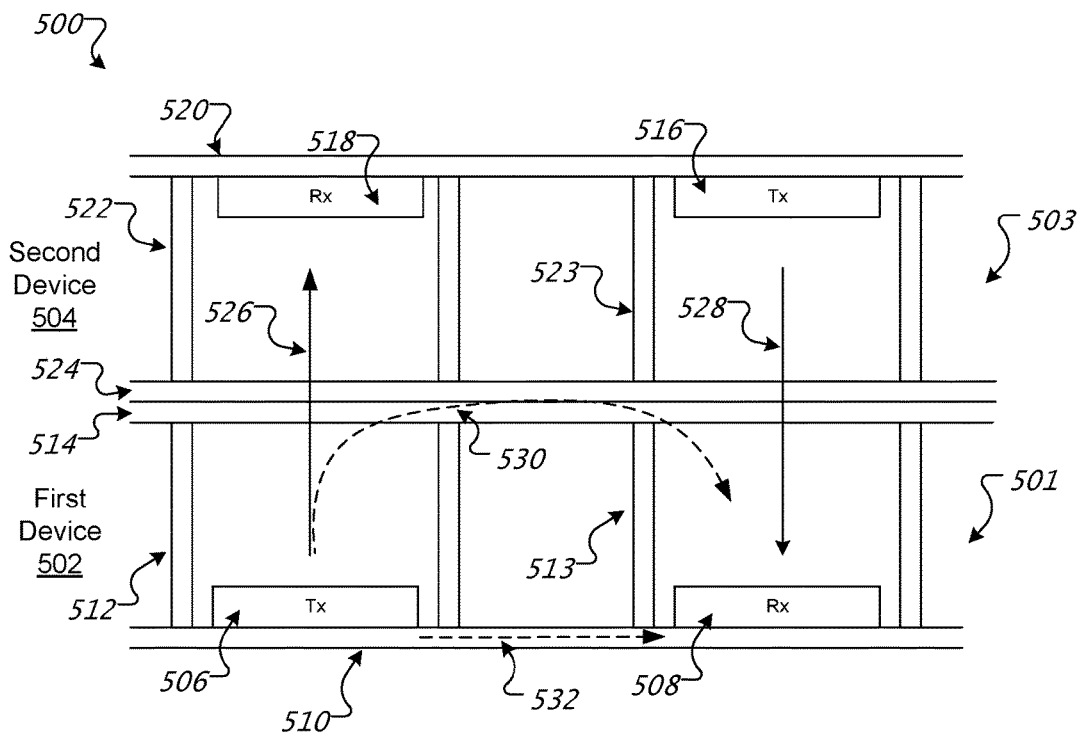
FIG. 5 shows a side view diagram illustrating an example of communication between a pair of communication modules.
Figure 6:
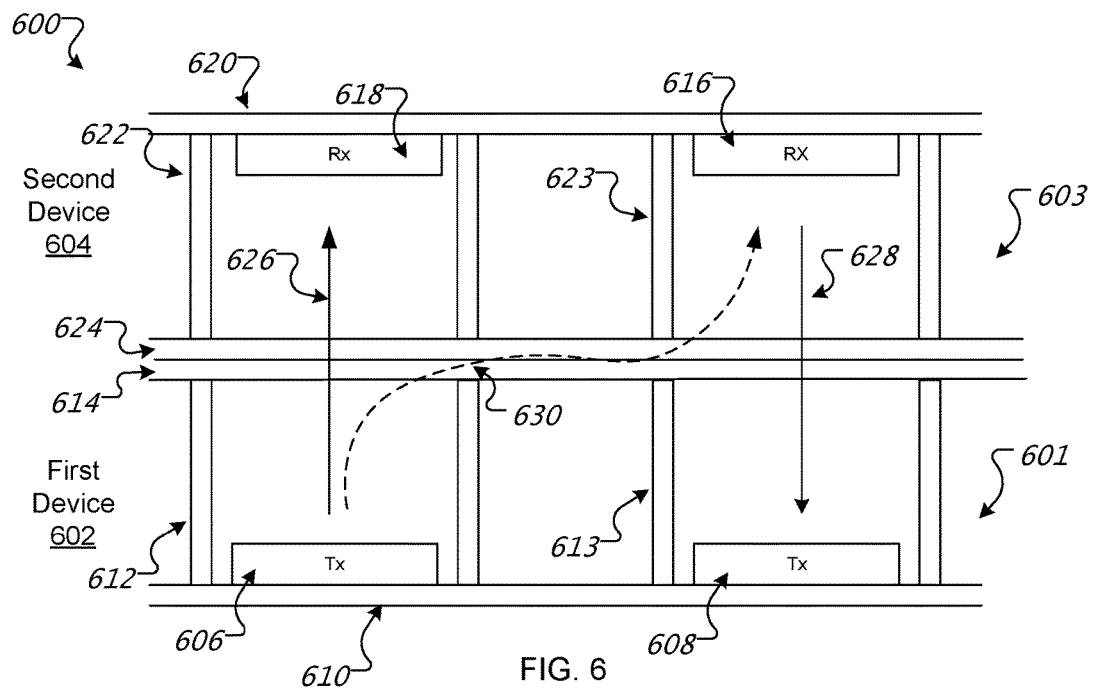
FIG. 6 shows a side view diagram illustrating a second example of communication between a pair of communication modules.

FIG. 5 shows a side view diagram 500 illustrating an example of communication between a pair of communication modules. Diagram 500 includes a portion of a first device 502 and a second device 504.

The first device 502 includes a first communication module 501. The first communication module 501 includes a first transmitter IC package 506 and a first receiver IC package 508 mounted to a first PCB 510. Each of the first transmitter IC package 506 and the first receiver IC package 508 is encircled by a respective first signal guiding structure 512, 513. The first signal guiding structures 512, 513 each form a channel extending from the respective IC package to a surface of a first housing 514 of the first device 502. For example, the first device 502 can be a first mobile phone and the first housing 514 can correspond to the outer case of the first mobile phone.

The second device 504 includes a second communication module 503. The second communication module 503 includes a second transmitter IC package 516 and a second receiver IC package 518 mounted to a second PCB 520. Each of the second transmitter IC package 516 and the second receiver IC package 518 is encircled by a respective second signal guiding structure 522, 523. The second signal guiding structures 522, 523 each provide a channel extending from the respective IC package to a surface of a second housing 524 of the second device 502. For example, the second device 502 can be a second mobile phone and the second housing 524 can correspond to the outer case of the second mobile phone.

As shown in FIG. 5, the first signal guiding structures 512, 513 and the second signal guiding structures 522, 523 are substantially aligned on either side of the respective first and second housings 514, 524. The alignment assists in decreasing loss from a data transmission 526 from the first transmitter IC package 506 to the second receiver IC package 518 and a data transmission 528 from the second transmitter IC package 516 to the first receiver IC package 508.

As described above, each signal guiding structure is configured to aid in directing radio frequency (RF) signals as well as to reduce interference from spurious signals. The signal guiding structure can at least partially surround a perimeter of the IC package and extend in the direction of signal transmission and/or reception by a specified "height" amount to provide a channel for emitted or received RF signals. The signal guiding structure can be composed of a suitable material that is configured to reduce extraneous signals without disrupting passage of communications along the channel formed by the signal guiding structure.

Even with the signal guiding structures, the potential for unintended coupling between channels can occur. Unintended coupling can occur when signals transmitted by a transmitter IC package are received by unintended receivers. Due to the nature of the electromagnetic field generated by the transmitted signals, particularly at certain frequencies, some signals emitted from the first transmitter IC package 506 and intended for the second receiver IC package 518 can propagate to the adjacent channel and the first receiver IC package 508.

The cross-talk provided by signal leakage through the device housings and PCB can cause coupling between the first transmitter IC package 506 to the first receiver IC package 508. For example, as shown in FIG. 5, the signal guiding structures 512 and 513 extend to the housing 514 of the first device 502. The respective housings have a thickness that results in a gap between the corresponding signal guiding structures along the transmission path. Additionally, the housing may be formed of a material that facilitates propagation of EM signals, e.g., a dielectric material. As a result, signals can propagate through the first housing 514 and/or the second housing 524, bypassing the signal guiding structures 512, 513, as illustrated by dashed line 530. The signals can then be received by the first receiver IC package 508. Additionally, signals can propagate through the first PCB 510 where the signals can be received by the first receiver IC package 508, as illustrated by dashed line 532.

FIG. 6 shows a side view diagram 600 illustrating a second example of communication between a pair of communication modules.

Diagram 600 includes a portion of a first device 602 and a second device 604. The first device 602 includes a first communication module 601. The first communication module 601 includes a first transmitter IC package 606 and a second transmitter IC package 608 mounted to a first PCB 610. Each of the first transmitter IC package 606 and the second transmitter IC package 608 is at least partially encircled by a respective first signal guiding structure 612, 613 similar to the signal guiding structures described above. The first signal guiding structures 612, 613 each form a channel extending from the respective IC package to a surface of a first housing 614 of the first device 602. For example, the first device 602 can be a first mobile phone and the first housing 614 can correspond to the outer case of the first mobile phone.

The second device 604 includes a second communication module 603. The second communication module 603 includes a first receiver IC package 616 and a second receiver IC package 618 mounted to a second PCB 620. Each of the first receiver IC package 616 and the second receiver IC package 618 is at least partially encircled by a respective second signal guiding structure 622, 623. The second signal guiding structures 622, 623 each provide a channel extending from the respective IC package to a surface of a second housing 624 of the second device 602. For example, the second device 602 can be a second mobile phone and the second housing 624 can correspond to the outer case of the second mobile phone.

Unintended coupling of signals can also occur between communication modules. In particular, while signals transmitted by the first transmitter IC package 606 are intended for receipt by the second receiver IC package 618, some signals emitted from the first transmitter IC package 606 may be received by the first receiver IC package 616 of the second device 604. In particular, signals can propagate through the first housing 614 and/or the second housing 624, bypassing the first signal guiding structures 612, 613 and second signal guiding structures 622, 623. As a result, the cross-talk provided by signal leakage through the device housings can cause unintended coupling between the first transmitter IC package 606 of the first device 602 with the first receiver IC package 616 of the second device 604, as illustrated by dashed line 630.

Figure 7:
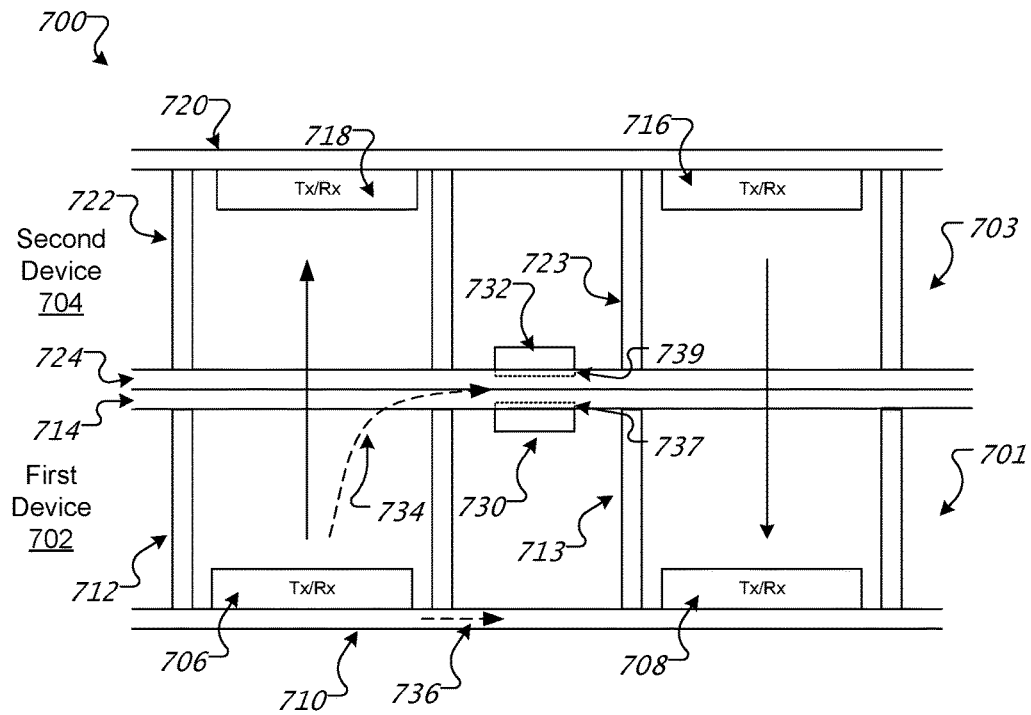
FIG. 7 shows a side view diagram illustrating a pair of communication modules including a signal blocking structure.

FIG. 7 shows a side view diagram 700 illustrating a pair of communication modules including a signal blocking structure.

Diagram 700 includes a portion of a first device 702 and a second device 704. The first device 702 includes a first communication module 701. The first communication module 701 includes a first transceiver IC package 706 and a second transceiver IC package 708 mounted to a first PCB 710. Each of the first transceiver IC package 706 and the second transceiver IC package 708 is at least partially encircled by a respective first signal guiding structure 712, 713 similar to the signal guiding structures described above.

The first signal guiding structures 712, 713 each form a channel extending from the respective transceiver IC package to a surface of a first housing 714 of the first device 702. For example, the first device 702 can be a first mobile phone and the first housing 714 can correspond to the outer case of the first mobile phone.

The first device 702 further includes a first blocking structure 730. The first blocking structure 730 is spatially positioned adjacent to first housing 714 and between the channels formed by the first signal guiding structures 712 and 713. In some implementations, the first blocking structure 730 is attached to the first housing 714, e.g., by a suitable fixing means such as an adhesive. In some other implementations, the first blocking structure 730 is formed at least partially within the first housing 714 such as part of the first housing 714 or within a recess formed in the first housing 714, illustrated by dashed portion 737 embedded within the first housing 714. Alternatively, in some other implementations, the blocking structure can be fully embedded within the first housing. Additionally, in some implementations, the first housing includes a recess or open aperture without the blocking structure, as described in greater detail below. In some other implementations, the spatial position of the first blocking structure 730 can be any suitable position within the electromagnetic field generated by signals leaking from the first transceiver IC package 706 toward the second transceiver package 708.

The second device 704 includes a second communication module 703. The second communication module 703 includes a third transceiver IC package 716 and a fourth transceiver IC package 718 mounted to a second PCB 720. Each of the third transceiver IC package 716 and the fourth transceiver IC package 718 is at least partially encircled by a respective second signal guiding structure 722, 723.

The second signal guiding structures 722, 723 each provide a channel extending from the respective transceiver IC package to a surface of a second housing 724 of the second device 704. For example, the second device 702 can be a second mobile phone and the second housing 724 can correspond to the outer case of the second mobile phone.

The second device 704 further includes a second blocking structure 732. The second blocking structure 732 is spatially positioned adjacent to second housing 724 and between the channels formed by the second signal guiding structures 722 and 723. Similar to the first blocking structure 730, in some implementations, the second blocking structure 732 is attached to the second housing 724, e.g., by a suitable fixing means such as an adhesive. In some other implementations, the second blocking structure 732 is formed at least partially within the first housing 724 either as part of the second housing 724 or within a recess formed in the second housing 724, illustrated by dashed portion 739 embedded within the second housing 724.

For convenience, each IC package is referred to as a transceiver IC package. In particular implementations, the transceiver IC package may instead be a transmitter IC package, a receiver IC package, or may be an IC package configured to operate selectively as a transmitter or receiver. Thus, the transceivers can correspond to the paired transmitter IC packages and receiver IC packages of either FIG. 5 or 6.

Each of the first and second blocking structures 730, 732 are configured to disrupt an electromagnetic field associated with signals propagating across channels of the communication modules 701, 703, illustrated by dashed path 734 showing propagation through one or more device housing and dashed path 736 showing propagation of signals through the PCB 710.

Each blocking structure is formed from a material that absorbs electromagnetic radiation, particularly radio frequency electromagnetic radiation including EHF RF electromagnetic radiation. For example, the blocking structure can be composed of a silica-ferrite material, e.g., a material formed by mixing small iron pieces with silicon. In some implementations, the material is further selected based on heat tolerance properties. For example, the material can be selected based in part on a melting or deformation point in excess of temperatures generated by device components including the communication module and other electronics contained in the device. In some implementations, an epoxy based ferrite material could be used as a blocking structure having a suitable heat tolerance. Other absorbing materials can be used to form the blocking structure, for example, other ferrite materials or carbon based materials.

The dimensions of the blocking structure can depend on the material used and the dimensions of the communication module, e.g., the spacing between channels or the width of the IC packages. Additionally, the size of the blocking structure can depend on the wavelength of the electromagnetic signals.

Because the leaking signals are part of an electromagnetic field, propagation can be significantly disrupted even without the blocking structure being directly in a line of sight path of the propagation. Thus, although the first blocking structure 730 is positioned adjacent to the first housing 714, the blocking structure is able to disrupt propagation both through the first housing 714 and the first PCB 710 as shown by paths 734 and 736.

Use of the blocking structure can reduce cross-talk generated by unintended coupling. For example, in some implementations, cross talk caused by the unintended coupling can be reduced by up to 10 dB relative to the cross talk without the signal blocking structure. Reducing cross-talk can improve performance of communications between paired transmitter and receiver IC packages.

Figure 8:
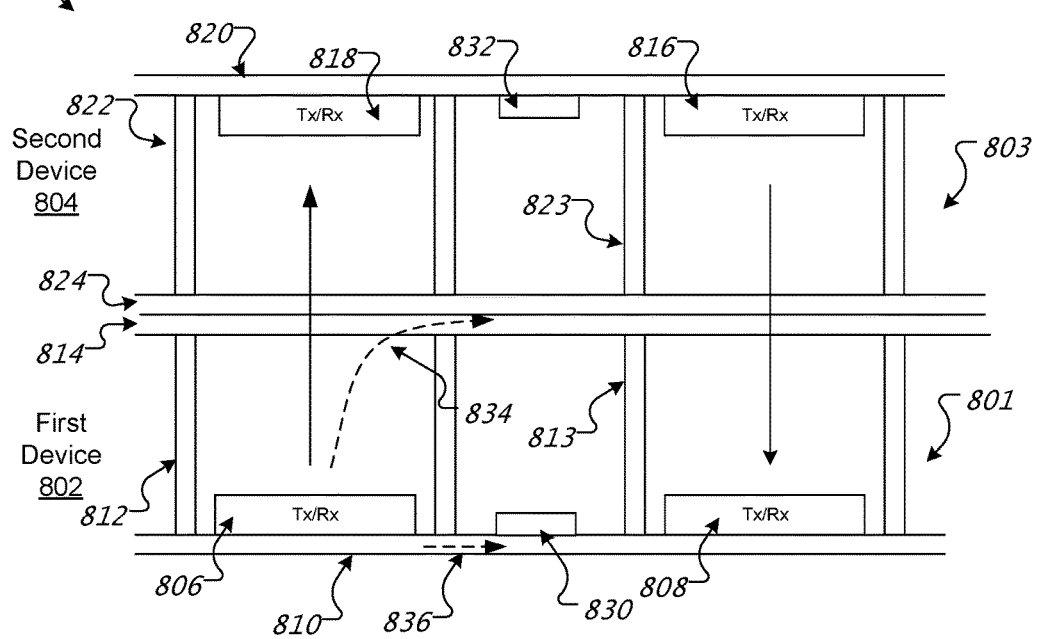
FIG. 8 shows a side view diagram illustrating a pair of communication modules including a signal blocking structure.

FIG. 8 shows a side view diagram 800 illustrating a pair of communication modules including a signal blocking structure.

Diagram 800 includes a portion of a first device 802 and a second device 804. The first device 802 includes a first communication module 801. The first communication module 801 includes a first transceiver IC package 806 and a second transceiver IC package 808 mounted to a first PCB 810. Each of the first transceiver IC package 806 and the second transceiver IC package 808 is at least partially encircled by a respective first signal guiding structure 812, 813 similar to the signal guiding structures described above.

The first signal guiding structures 812, 813 each form a channel extending from the respective transceiver IC package to a surface of a first housing 814 of the first device 802. For example, the first device 802 can be a first mobile phone and the first housing 814 can correspond to the outer case of the first mobile phone.

The first device 802 further includes a first blocking structure 830. The first blocking structure 830 is spatially positioned adjacent to the first PCB 810 and between the channels formed by the first signal guiding structures 812 and 813.

The second device 804 includes a second communication module 803. The second communication module 803 includes a third transceiver IC package 816 and a fourth transceiver IC package 818 mounted to a second PCB 820. Each of the third transceiver IC package 816 and the fourth transceiver IC package 818 is at least partially encircled by a respective second signal guiding structure 822, 823.

The second signal guiding structures 822, 823 each provide a channel extending from the respective transceiver IC package to a surface of a second housing 824 of the second device 804. For example, the second device 804 can be a second mobile phone and the second housing 824 can correspond to the outer case of the second mobile phone.

The second device 804 further includes a second blocking structure 832. The second blocking structure 832 is spatially positioned adjacent to the second PCB 820 and between the channels formed by the second signal guiding structures 822 and 823.

As above, each IC package is referred to as a transceiver IC package for convenience. In particular implementations, the transceiver IC package may instead be a transmitter IC package, a receiver IC package, or may be an IC package configured to operate selectively as a transmitter or receiver.

Similar to the signal blocking structures described above with respect to FIG. 7, each of the first and second blocking structures 830, 832 are configured to disrupt an electromagnetic field associated with signals propagating across channels of the communication modules 801, 803, illustrated by dashed path 834 showing propagation through one or more of the device housings and dashed path 836 showing propagation of signals through the PCB 810.

As described above, propagation can be significantly disrupted even without being positioned directly in a line of sight path between the channels. Thus, although the first blocking structure 830 is positioned adjacent to the first PCB 810, the blocking structures are able to disrupt propagation both through the housing and the first PCB 810 as shown by paths 834 and 836.

FIGS. 7 and 8 show two example positions for signal blocking structures. However other suitable positions can be used. For example, the signal blocking structure can be positioned at a point between the PCB and the housing, e.g., the signal blocking structure can be elevated over the PCB surface by a support structure mounted on the PCB or extending from the housing. In some other implementations, the signal blocking structure is partially embedded within a recess formed in the housing or a recess formed in the PCB. In some implementations, the relative position of the blocking structure with respect to the PCB and the housing can affect the degree of cross-talk reduction from the respective sources. For example, positioning the blocking structure closer to the PCB may result in a greater reduction of electromagnetic signals propagating through the PCB than the reduction of electromagnetic signals propagating through the housing. Similarly, positioning the blocking structure closer to the housing may result in a greater reduction of electromagnetic signals propagating through the housing than the reduction of electromagnetic signals propagating through the PCB. The particular position of the blocking structure can be selected, for example, to optimize the reduction overall or to optimize the reduction from a particular source path, e.g., through the PCB.

Figure 9:
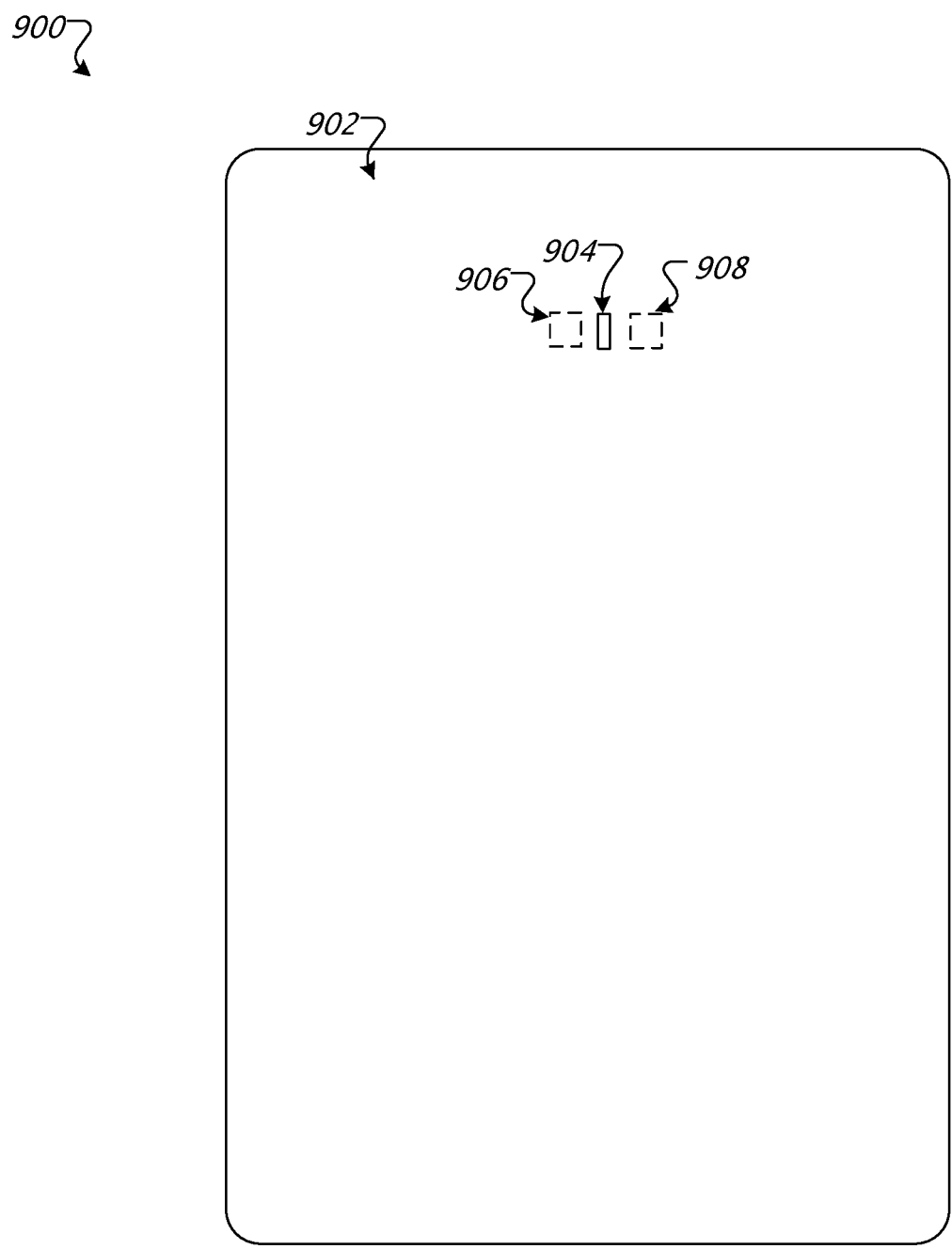
FIG. 9 shows a top view of a device housing incorporating a signal blocking structure.

FIG. 9 shows a view 900 of a device housing portion 902 incorporating a blocking structure 904. The device housing portion 902 can be, for example, a portion of a device case e.g., for a mobile phone or tablet device. In particular, view 900 can represent an interior portion of the device case.

The blocking structure 904 is positioned on the device housing portion 902. In some implementations, the blocking structure 904 is affixed to a surface of the device housing portion 902. In some other implementations, the blocking structure 904 is positioned within a recess formed in the device housing portion 902. The blocking structure 904 is positioned such that when the housing portion 902 is positioned over a communication module, the blocking structure 904 is located between the channels of a pair of transceiver IC packages, represented by dashed boxes 906 and 908.

Figure 10:
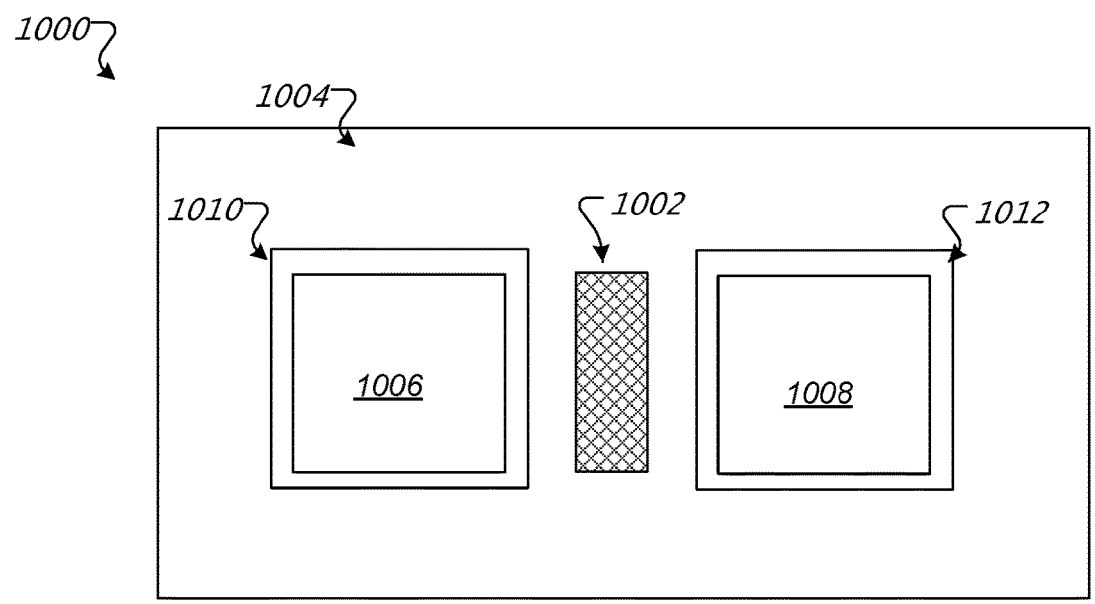
FIG. 10 shows a top view of a communication module incorporating a signal blocking structure.

FIG. 10 shows a top view of a communication module 1000 incorporating a blocking structure 1002. The communication module 1000 includes a PCB 1004. Positioned on PCB 1004 are a first transceiver IC package 1006 and a second transceiver IC package 1008. The first transceiver IC package 1006 is surrounded by a first signal guiding structure 1010. The second transceiver IC package 1008 is surrounded by a second signal guiding structure 1012. Each signal guiding structure can have a specified height dimension extending above the PCB 1004, for example, based on the distance between the communication module 1000 and a housing structure. The blocking structure 1002 is positioned between the two channels formed by the first signal guiding structure 1010 and the second signal guiding structure 1012. For example, the blocking structure 1002 can be positioned on the PCB 1004. In some other implementations, the blocking structure can be positioned on a suitable support structure that elevates the blocking structure 1002 over the surface of the PCB 1004 by a specified amount.

Figure 11:
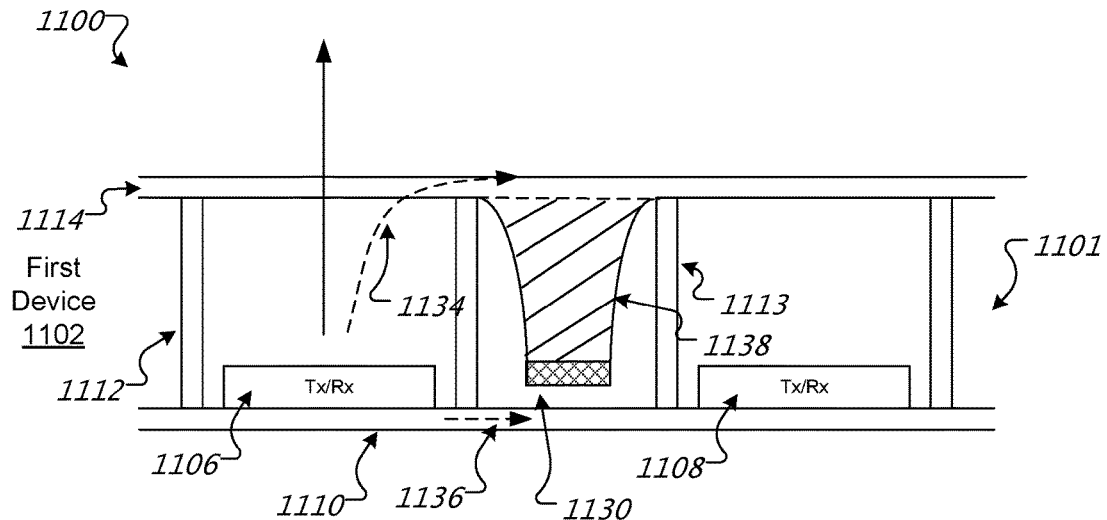
FIG. 11 shows a side view diagram illustrating a communication module including a signal blocking structure.

FIG. 11 shows a side view diagram 1100 illustrating a communication module including a signal blocking structure. Diagram 1100 includes a portion of a first device 1102. In operation, the first device 1102 can be positioned relative to a second device, for example, similar to those shown in FIGS. 7-8, e.g., to communicate data. However, the portion of the second device is not shown in FIG. 11 for clarity.

The first device 1102 includes a communication module 1101. The communication module 1101 includes a first transceiver IC package 1106 and a second transceiver IC package 1108 mounted to a PCB 1110. Each of the first transceiver IC package 1106 and the second transceiver IC package 1108 is at least partially encircled by a respective signal guiding structure 1112, 1113 similar to the signal guiding structures described above.

The signal guiding structures 1112, 1113 each form a channel extending from the respective transceiver IC package to a surface of a housing 1114 of the first device 1102. For example, the first device 1102 can be a mobile phone and the housing 1114 can correspond to the outer case of the mobile phone.

The first device 1102 further includes a blocking structure 1130. The blocking structure 1130 is spatially positioned between the channels formed by the signal guiding structures 1112 and 1113. As shown in FIG. 11, the blocking structure 1130 is mounted to a protrusion 1138 of the housing 1114. The protrusion 1138 can act as a trough that helps draw the electromagnetic signals propagating through the housing 1114 toward the blocking structure 1130. The protrusion 1138 can have any suitable shape including straight, angled, and curved. The length of the protrusion 1138 can vary such that the blocking structure 1130 can have a range of positions relative to the housing 1114 and the PCB 1110 including being positioned on top of the PCB 1110. In some implementations, a longer protrusion 1138 may be used so that the blocking structure 1130 is closer to the PCB 1110 can improve the reduction of crosstalk due to signal propagation through the PCB 1110, illustrated by path 1136, relative to a position that is closer to the housing 1114.

The protrusion 1138 can be formed from the same material as the housing 1114 or can be formed from a different material. In particular, when the housing is formed from a dielectric material, e.g., plastic, the protrusion 1138 may be formed from the same material such that dielectric constants are matching. In some other implementations, the housing 1114 and protrusion 1138 can be formed from different materials that can have different dielectric constants. The effect of changing dialectic materials can further disrupt the propagating electromagnetic signals allowing more energy to be absorbed. The effects of the differences in material depend on the particular materials used for the housing 1114 and the protrusion 1138.

In some implementations, the housing and protrusion are manufactured together, e.g., through a molding process such as injection molding. Additionally, the protrusion can have a specified length and shape suitable for the particular communication module, for example, to provide a particular degree of cross-talk reduction within design and manufacturing constraints.

As above, each IC package is referred to as a transceiver IC package. In particular implementations, the transceiver IC package may instead be a transmitter IC package, a receiver IC package, or may be an IC package configured to operate selectively as a transmitter or receiver.

Similar to the signal blocking structures described above with respect to FIG. 7, the blocking structure 1130 is configured to disrupt an electromagnetic field associated with signals propagating across channels of the communication module 1101, as illustrated by dashed path 1134 showing propagation through the housing (and possibly a second housing of a second device) and the dashed path 1136 showing propagation of signals through the PCB 1110.

As described above, propagation can be significantly disrupted even without being positioned directly in a line of sight path between the channels. Thus, although the blocking structure 1130 is positioned spatially between the PCB 1110 and the housing 1114, the blocking structure 1130 is able to disrupt propagation both through the housing 1114 and the PCB 1110.

Figure 12:
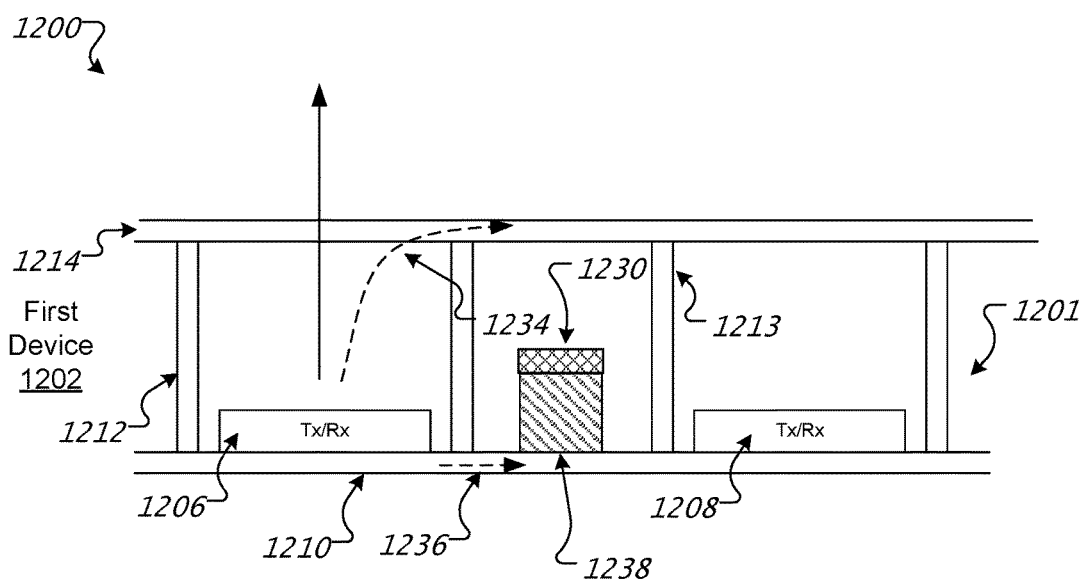
FIG. 12 shows a side view diagram illustrating a communication module including a signal blocking structure.

FIG. 12 shows a side view diagram 1200 illustrating a communication module including a signal blocking structure. Diagram 1200 includes a portion of a first device 1202. In operation, the first device 1202 can be positioned relative to a second device, for example, similar to those shown in FIGS. 7-8, e.g., to communicate data. However, the portion of the second device is not shown in FIG. 12 for clarity.

The first device 1202 includes a communication module 1201. The communication module 1201 includes a first transceiver IC package 1206 and a second transceiver IC package 1208 mounted to a PCB 1210. Each of the first transceiver IC package 1206 and the second transceiver IC package 1208 is at least partially encircled by a respective signal guiding structure 1212, 1213 similar to the signal guiding structures described above.

The signal guiding structures 1212, 1213 each form a channel extending from the respective transceiver IC package to a surface of a housing 1214 of the first device 1202. For example, the first device 1202 can be a mobile phone and the housing 1214 can correspond to the outer case of the mobile phone. The first device 1202 further includes a blocking structure 1230. The blocking structure 1230 is spatially positioned between the channels formed by the signal guiding structures 1212 and 1213.

As shown in FIG. 12, the blocking structure 1230 is mounted to a support structure 1238. The support structure 1238 can have a specified height suitable for the particular communication module, for example, to provide a degree of cross-talk reduction within particular design and manufacturing constraints. For example, the support structure 1238 can be short such that the first blocking structure 1230 is closer to the PCB 1210 than the housing 1214. The support structure 1238 can be formed from a dielectric material, e.g., plastic. In some other implementations, the support structure 1238 and blocking structure 1230 can be formed from different materials that can have different dielectric constants. The effect of changing dialectic materials when crossing from the support structure 1238 to the blocking structure 1230 can further disrupt the propagating electromagnetic signals allowing more energy to be absorbed.

Alternatively, the support structure 1238 can be taller such that the blocking structure 1230 is closer to the housing 1214 than the PCB 1210. In some implementations, the support structure 1238 has a height such that the blocking structure 1230 is touching the housing 1214. The different positions can affect the degree of cross talk reduction along the respective paths 1234 and 1236 provided by the blocking structure 1230. As above, each IC package is referred to as a transceiver IC package. In particular implementations, the transceiver IC package may instead be a transmitter IC package, a receiver IC package, or may be an IC package configured to operate selectively as a transmitter or receiver.

Similar to the signal blocking structures described above with respect to FIG. 7, the blocking structure 1230 is configured to disrupt an electromagnetic field associated with signals propagating across channels of the communication module 1201, as illustrated by dashed path 1234 showing propagation through the housing (and possibly a second housing of a second device) and the dashed path 1236 showing propagation of signals through the PCB 1210.

As described above, propagation can be significantly disrupted even without being positioned directly in a line of sight path between the channels. Thus, although the blocking structure 1230 is positioned spatially between the PCB 1210 and the housing 1214, the blocking structure 1230 is able to disrupt propagation both through the housing 1214 and the PCB 1210.

Figure 13:
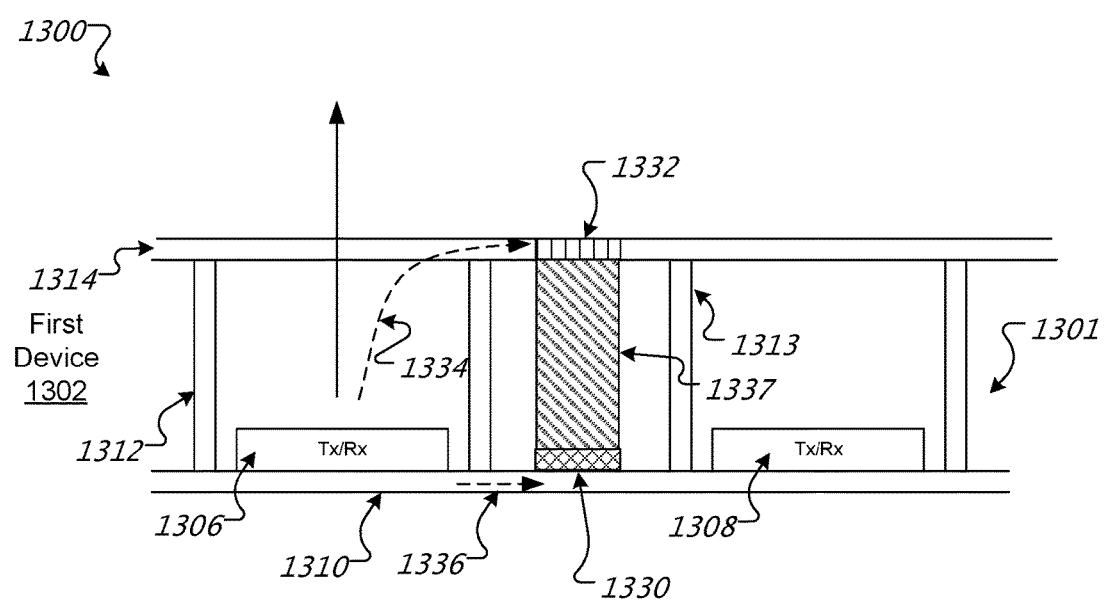
FIG. 13 shows a side view diagram illustrating a communication module including a signal blocking structure.

FIG. 13 shows a side view diagram 1300 illustrating a communication module including a signal blocking structure. Diagram 1300 includes a portion of a first device 1302. In operation, the first device 1302 can be positioned relative to a second device, for example, similar to those shown in FIGS. 7-8, e.g., to communicate data. However, the portion of the second device is not shown in FIG. 13 for clarity.

The first device 1302 includes a communication module 1301. The communication module 1301 includes a first transceiver IC package 1306 and a second transceiver IC package 1308 mounted to a PCB 1310. Each of the first transceiver IC package 1306 and the second transceiver IC package 1308 is at least partially encircled by a respective signal guiding structure 1312, 1313 similar to the signal guiding structures described above.

The signal guiding structures 1312, 1313 each form a channel extending from the respective transceiver IC package to a surface of a housing 1314 of the first device 1302. For example, the first device 1302 can be a mobile phone and the housing 1314 can correspond to the outer case of the mobile phone.

The first device 1302 further includes a blocking structure 1330. The blocking structure 1330 is spatially positioned between the channels formed by the signal guiding structures 1312 and 1313. As shown in FIG. 13, the blocking structure 1330 is positioned on the PCB 1310. A dielectric material 1337 is positioned between the blocking structure 1330 and an absorbing material 1332. The absorbing material 1332 is part of the housing 1314. The absorbing material 1332 can be formed of a suitable material that absorbs electromagnetic signals. The dielectric material 1337 can be similar, in construction and/or function, to the protrusion 1138 described above with respect to FIG. 11. The dielectric material 1337 can act as a trough that helps draw the electromagnetic signals propagating through the housing 1314 and absorbing material 1332 toward the blocking structure 1330.

As above, each IC package is referred to as a transceiver IC package for convenience. In particular implementations, the transceiver IC package may instead be a transmitter IC package, a receiver IC package, or may be an IC package configured to operate selectively as a transmitter or receiver.

Similar to the signal blocking structures described above with respect to FIG. 7, the blocking structure 1330 is configured to disrupt an electromagnetic field associated with signals propagating across channels of the communication module 1301, as illustrated by dashed path 1334 showing propagation through the housing (and possibly a second housing of a second device) and the dashed path 1336 showing propagation of signals through the PCB 1310.

As described above, propagation can be significantly disrupted even without being positioned directly in a line of sight path between the channels. Thus, although the blocking structure 1330 is positioned spatially between the PCB 1310 and the housing 1314, the blocking structure 1330 is able to disrupt propagation both through the housing 1314 and the PCB 1310.

Figure 14:
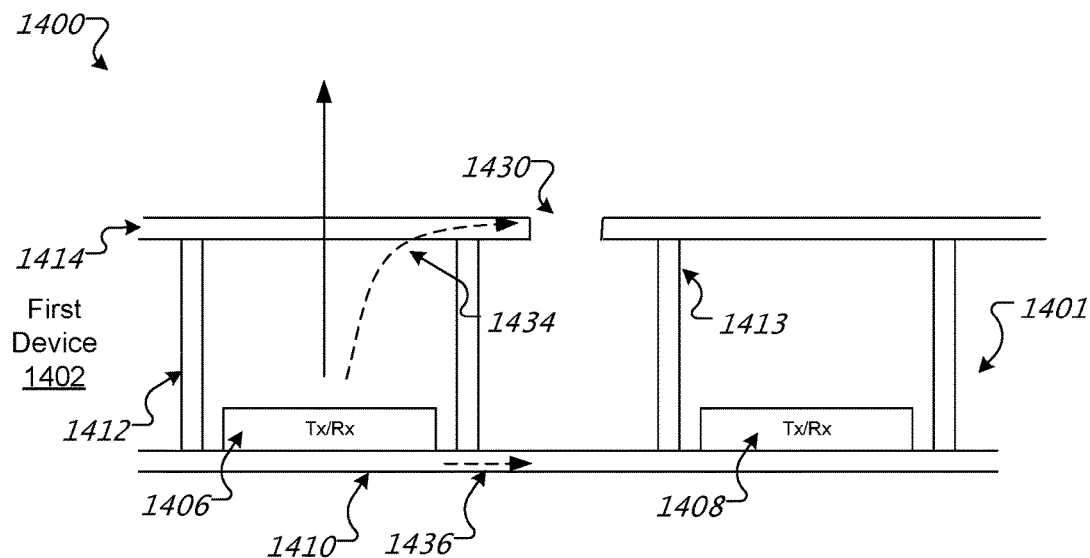
FIG. 14 shows a side view diagram illustrating a communication module including a signal blocking aperture.

FIG. 14 shows a side view diagram 1400 illustrating a communication module including a signal blocking aperture. Diagram 1400 includes a portion of a first device 1402. In operation, the first device 1402 can be positioned relative to a second device, for example, similar to those shown in FIGS. 7-8, e.g., to communicate data. However, the portion of the second device is not shown in FIG. 14 for clarity.

The first device 1402 includes a communication module 1401. The communication module 1401 includes a first transceiver IC package 1406 and a second transceiver IC package 1408 mounted to a PCB 1410. Each of the first transceiver IC package 1406 and the second transceiver IC package 1408 is at least partially encircled by a respective signal guiding structure 1412, 1413 similar to the signal guiding structures described above.

The signal guiding structures 1412, 1413 each form a channel extending from the respective transceiver IC package to a surface of a housing 1414 of the first device 1402. For example, the first device 1402 can be a mobile phone and the housing 1414 can correspond to the outer case of the mobile phone.

The first device 1402 further includes a signal blocking aperture 1430. The signal blocking aperture 1430 is spatially positioned between the channels formed by the signal guiding structures 1412 and 1413. As shown in FIG. 14, the signal blocking aperture 1430 forms an opening in the housing 1414.

As above, each IC package is referred to as a transceiver IC package for convenience. In particular implementations, the transceiver IC package may instead be a transmitter IC package, a receiver IC package, or may be an IC package configured to operate selectively as a transmitter or receiver.

Similar to the signal blocking structures described above with respect to FIG. 7, the signal blocking aperture 1430 is configured to disrupt an electromagnetic field associated with signals propagating across channels of the communication module 1401, as illustrated by dashed path 1434 showing propagation through the housing (and possibly a second housing of a second device) and the dashed path 1436 showing propagation of signals through the PCB 1410.

As described above, propagation can be significantly disrupted even without being positioned directly in a line of sight path between the channels. Thus, although the signal blocking aperture 1430 is an opening spatially positioned in the first housing 1414, the signal blocking aperture 1430 is able to disrupt propagation both through the housing 1414 and the PCB 1410.

In some implementations, a signal blocking structure can be included in addition to the signal blocking aperture 1430. The signal blocking structure can be positioned adjacent to the housing beneath the signal blocking aperture 1430, atop the PCB 1410, or some location between the housing and the PCB 1410, any suitable blocking structure as described in FIGS. 7-13 can be can be combined with the signal blocking aperture 1430 of FIG. 14.

Figure 15:
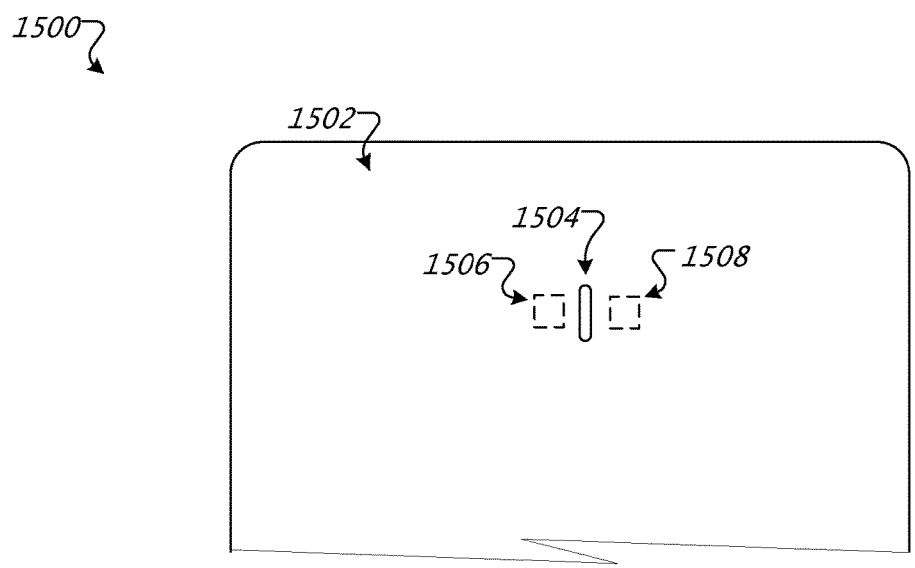
FIG. 15 shows a top view of a device housing incorporating the signal blocking aperture of FIG. 14.

FIG. 15 shows a top view diagram 1500 of a device housing portion 1502 incorporating a signal blocking aperture 1504 such as the signal blocking aperture 1430 of FIG. 14. The device housing portion 1502 can be, for example, a portion of a device case e.g., for a mobile phone or tablet device. In particular, view 1500 can represent an exterior portion of the device case, e.g., as viewed from outside the device.

The signal blocking aperture 1504 is an opening in the device housing portion 1502. The signal blocking aperture 1504 is positioned spatially between IC packages of an underlying communication module. The relative positions of the IC packages to the signal blocking aperture 1504 are represented by dashed lines 1506 and 1508.

In some implementations, the regions formed by the respective dashed lines 1506 and 1508 also represent a different material from the rest of the device housing portion 1502. For example, the device housing portion 1502 can be formed of a metal material that would prevent transmission of signals from a transmitter or to a receiver of the communication module. The dashed lines 1506 and 1508 can therefore also represent a portion of the device housing formed from a material that allows transmission of signals through the device housing.

Figure 16:
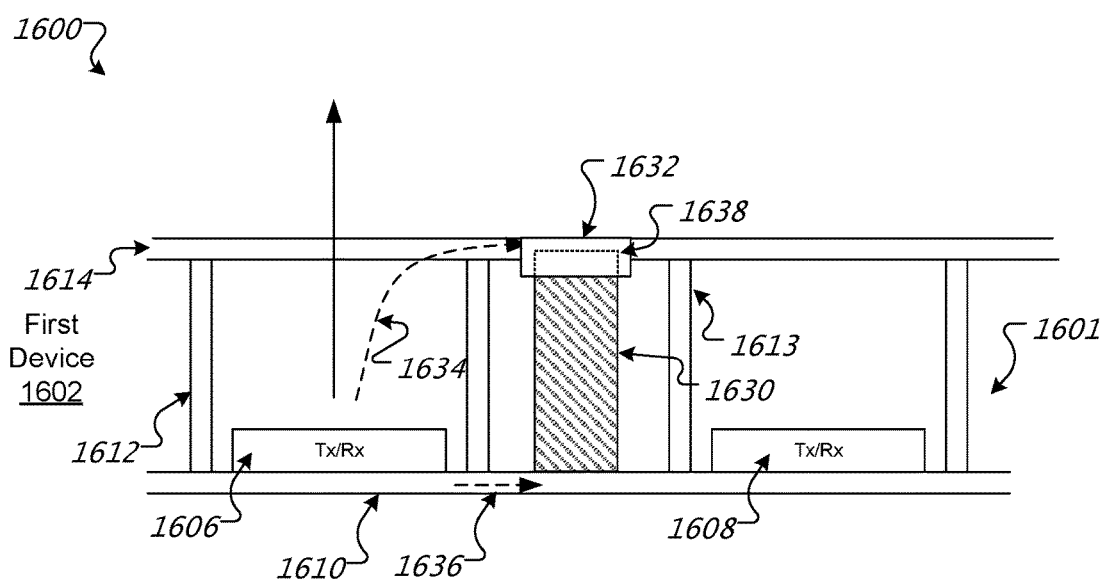
FIG. 16 shows a side view diagram illustrating a communication module including a signal blocking structure.

FIG. 16 shows a side view diagram 1600 illustrating a communication module including a signal blocking structure. Diagram 1600 includes a portion of a first device 1602. In operation, the first device 1602 can be positioned relative to a second device, for example, similar to those shown in FIGS. 7-8, e.g., to communicate data. However, the portion of the second device is not shown in FIG. 16 for clarity.

The first device 1602 includes a communication module 1601. The communication module 1601 includes a first transceiver IC package 1606 and a second transceiver IC package 1608 mounted to a PCB 1610. Each of the first transceiver IC package 1606 and the second transceiver IC package 1608 is at least partially encircled by a respective signal guiding structure 1612, 1613 similar to the signal guiding structures described above.

The signal guiding structures 1612, 1613 each form a channel extending from the respective transceiver IC package to a surface of a housing 1614 of the first device 1602. For example, the first device 1602 can be a mobile phone and the housing 1614 can correspond to the outer case of the mobile phone.

As above, each IC package is referred to as a transceiver IC package for convenience. In particular implementations, the transceiver IC package may instead be a transmitter IC package, a receiver IC package, or may be an IC package configured to operate selectively as a transmitter or receiver.

The first device 1602 further includes a blocking structure 1630 and an optional cap 1632. The blocking structure 1630 is spatially positioned between the channels formed by the signal guiding structures 1612 and 1613. As shown in FIG. 16, the blocking structure 1630 is positioned on the PCB 1610 and extends to the cap 1632. The cap 1632 can be an absorbing material at least partially positioned within the housing 1614. The cap 1632 can be formed of a suitable material that absorbs electromagnetic signals. In some implementations, for example as shown in FIG. 16, the cap 1632 extends beyond one or more of the width or depth of the blocking structure 1630.

In some implementations, the blocking structure 1630 is positioned adjacent to the cap 1632. In some other implementations, the blocking structure 1630 can be at partially encased within the cap 1632, for example, as represented by dotted line 1638.

Similar to the signal blocking structures described above with respect to FIG. 7, the blocking structure 1630 and cap 1632 are configured to disrupt an electromagnetic field associated with signals propagating across channels of the communication module 1601, as illustrated by dashed path 1634 showing propagation through the housing (and possibly a second housing of a second device) and the dashed path 1636 showing propagation of signals through the PCB 1610.

As described above, propagation can be significantly disrupted even without being positioned directly in a line of sight path between the channels. Thus, although the blocking structure 1630 is positioned spatially between the PCB 1610 and the housing 1614, the blocking structure 1630 in combination with the cap 1632 is able to disrupt propagation both through the housing 1614 and the PCB 1610.

In the example implementations described above, a portion of the housing through which signals pass to or from an IC package of a communication can be formed of a different material than other portions of the housing. For example, in some implementations a portion of the housing can be formed from a metallic material that would inhibit passage of the signals. To allow passage of the signals, a portion of the housing along the signal paths can be formed from another material, for example, an insert of a plastic material that allows signal passage.

A number of embodiments of the invention have been described. Nevertheless, it will be understood that various modifications may be made without departing from the spirit and scope of the invention. Accordingly, other embodiments are within the scope of the following claims.

While this specification contains many specific implementation details, these should not be construed as limitations on the scope of any invention or on the scope of what may be claimed, but rather as descriptions of features that may be specific to particular embodiments of particular inventions. Certain features that are described in this specification in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially be claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous. Moreover, the separation of various system modules and components in the embodiments described above should not be understood as requiring such separation in all embodiments, and it should be understood that the described program components and systems can generally be integrated together in a single software product or packaged into multiple software products.

Particular embodiments of the subject matter have been described. Other embodiments are within the scope of the following claims. For example, the actions recited in the claims can be performed in a different order and still achieve desirable results. As one example, the processes depicted in the accompanying figures do not necessarily require the particular order shown, or sequential order, to achieve desirable results. In some cases, multitasking and parallel processing may be advantageous.

What is claimed is:

1. An apparatus comprising:
    a communication module comprising:
        a transmitter integrated circuit package;
        a receiver integrated circuit package; and
        a printed circuit board, wherein the transmitter integrated circuit package and the receiver integrated circuit package are positioned on the printed circuit board;
    a signal blocking structure positioned between the transmitter integrated circuit package and the receiver integrated circuit package, wherein the signal blocking structure is positioned on the printed circuit board; and
    a discrete structure formed of a dielectric material and positioned between the transmitter integrated circuit package and the receiver integrated circuit package, wherein a first end of the discrete structure is in contact with a surface of the signal blocking structure and a second end is in contact with an absorbing material formed as part of a housing configured to enclose the communication module.

2. The communication module of claim 1, comprising a first signal guiding structure surrounding at least a portion of the transmitter integrated circuit package and a second signal guiding structure surrounding at least a portion of the receiver integrated circuit package.

3. The communication module of claim 1, wherein the signal blocking structure is configured to reduce cross-talk between the transmitter integrated circuit package and the receiver integrated circuit package.

4. The communication module of claim 1, wherein the signal blocking structure reduces cross-talk due to propagation of electromagnetic signals from the transmitter integrated circuit package through the printed circuit board.

5. The communication module of claim 1, wherein the signal blocking structure reduces cross-talk due to propagation of electromagnetic signals through the housing enclosing the communication module.

6. An apparatus comprising:
a communication module comprising:
a first transceiver integrated circuit package;
a second transceiver integrated circuit package; and
a printed circuit board, wherein the first transceiver integrated circuit package and the second transceiver integrated circuit package are positioned on the printed circuit board;
a signal blocking structure positioned between the first transceiver integrated circuit package and the second transceiver integrated circuit package, wherein the signal blocking structure is positioned on the printed circuit board; and
a discrete structure formed of a dielectric material and positioned between the first transceiver integrated circuit package and the second transceiver integrated circuit package, wherein a first end of the discrete structure is in contact with a surface of the signal blocking structure and a second end is in contact with an absorbing material formed as part of a housing configured to enclose the communication module.

7. The apparatus of claim 6, comprising a first signal guiding structure surrounding at least a portion of the first transceiver integrated circuit package and a second signal guiding structure surrounding at least a portion of the second transceiver integrated circuit package.

8. The apparatus of claim 7, wherein the first and second signal guiding structures each form a respective channel for passing electromagnetic signals.

9. The apparatus of claim 8, wherein the signal blocking structure is positioned between the channels formed by the signal guiding structures.

10. The apparatus of claim 6, wherein the signal blocking structure is configured to reduce cross-talk between the first transceiver integrated circuit package and the second transceiver integrated circuit package.

11. The apparatus of claim 6, wherein the signal blocking structure reduces cross-talk due to propagation of electromagnetic signals from the first transceiver integrated circuit package to the second transceiver integrated circuit package through the printed circuit board.

12. The apparatus of claim 6, wherein the signal blocking structure reduces cross-talk due to propagation of electromagnetic signals through the housing enclosing the communication module.

13. The apparatus of claim 6, wherein the signal blocking structure is composed of a silica-ferrite material.

14. The apparatus of claim 6, wherein the signal blocking structure is composed of an epoxy-ferrite material.

15. The apparatus of claim 2, wherein the first and second signal guiding structures each form a respective channel for passing electromagnetic signals.

16. The apparatus of claim 15, wherein the signal blocking structure is positioned between the channels formed by the signal guiding structures.

17. The apparatus of claim 1, wherein the signal blocking structure is composed of a silica-ferrite material.

18. The apparatus of claim 1, wherein the signal blocking structure is composed of an epoxy-ferrite material.

* * * * *